(12) United States Patent
Fried et al.

(10) Patent No.: US 7,064,019 B2
(45) Date of Patent: Jun. 20, 2006

(54) IMPLANTED ASYMMETRIC DOPED POLYSILICON GATE FINFET

(75) Inventors: David M. Fried, Williston, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 10/869,624

(22) Filed: Jun. 16, 2004

(65) Prior Publication Data

US 2004/0222466 A1 Nov. 11, 2004

Related U.S. Application Data

(62) Division of application No. 09/683,328, filed on Dec. 14, 2001, now Pat. No. 6,800,905.

(51) Int. Cl.
*H01L 21/84* (2006.01)
*H01L 21/8238* (2006.01)
*H01L 21/336* (2006.01)

(52) U.S. Cl. .................. 438/149; 438/217; 438/286
(58) Field of Classification Search ................ 438/149, 438/286, 217
See application file for complete search history.

(56) References Cited

U.S. PATENT DOCUMENTS

| | | | |
|---|---|---|---|
| 3,872,491 A | 3/1975 | Hanson et al. | |
| 5,315,143 A | 5/1994 | Tsuji | |
| 5,338,959 A | 8/1994 | Kim et al. | |
| 5,365,083 A | 11/1994 | Tada | |
| 5,391,506 A | 2/1995 | Tada et al. | |
| 6,031,269 A | 2/2000 | Liu | |
| 6,069,390 A | 5/2000 | Hsu et al. | |
| 6,150,687 A | 11/2000 | Noble et al. | |
| 6,207,530 B1 | 3/2001 | Hsu et al. | |
| 6,207,985 B1 | 3/2001 | Walker | |
| 6,242,783 B1 | 6/2001 | Ohmi et al. | |
| 6,300,182 B1 * | 10/2001 | Yu | 438/217 |
| 6,380,043 B1 * | 4/2002 | Yu | 438/305 |
| 6,458,662 B1 * | 10/2002 | Yu | 438/286 |
| 6,475,869 B1 * | 11/2002 | Yu | 438/303 |
| 6,525,403 B1 * | 2/2003 | Inaba et al. | 257/618 |
| 6,746,904 B1 * | 6/2004 | Van der Zaag et al. | 438/149 |
| 6,768,158 B1 * | 7/2004 | Lee et al. | 257/315 |

OTHER PUBLICATIONS

Leland Chang, et al., "Gate Length Scaling and Threshold Voltage Control of Double-Gate MOSFET's", Department of Electrical Engineering and Computer Sciences, University of California, 2000 IEEE.

(Continued)

*Primary Examiner*—Walter L. Lindsay, Jr.
(74) *Attorney, Agent, or Firm*—Scully, Scott, Murphy & Presser; Anthony Canale

(57) ABSTRACT

An asymmetric field effect transistor (FET) that has a threshold voltage that is compatible with current CMOS circuit designs and a low resistive gate electrode is provided. Specifically, the asymmetric FET includes a p-type gate portion and an n-type gate portion on a vertical semiconductor body; an interconnect between the p-type gate portion and the n-type gate portion; and a planarizing structure above the interconnect.

11 Claims, 9 Drawing Sheets

OTHER PUBLICATIONS

Keunwoo Kim, et al., Optimal Double-Gate MOSFET's: Symmetrical or Asymmetrical Gates?, 1999 IEEE International SOI Conference, Oct. 1999, (pp. 98-99).

Yan, et al., Scaling the Si MOSFET: From Bulk to SOI Bulk, IEEE Transactions on Electron Devices, vol. 39, No. 7, p. 1704, Jul. 1992.

\* cited by examiner

IMPLANTED ASYMMETRIC DOPED POLYSILICON GATE FINFET

RELATED APPLICATION

This application is a divisional of U.S. application Ser. No. 09/683,328, filed Dec. 14, 2001. U.S. Pat. No. 6,800,905.

FIELD OF THE INVENTION

The present invention relates to semiconductor devices, and more particularly to an implanted asymmetric doped polysilicon-containing gate FinFET structure that is integrated with a thick polysilicon-containing gate. The present invention is also directed to a method to integrate the implanted asymmetric polysilicon-containing gate FinFET with a thick polysilicon-containing gate for manufacturing integration.

BACKGROUND OF THE INVENTION

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease of threshold voltage $V_t$ in short-channel devices due to two-dimensional electrostatic charge sharing between the gate and the source/drain diffusion regions.

To scale down MOSFET channel lengths without excessive short-channel effects, gate oxide thickness has to be reduced while increasing channel-doping concentration. However, Yan, et al., "Scaling the Si MOSFET: From bulk to SOI to bulk", IEEE Trans. Elect. Dev., Vol. 39, p. 1704, July 1992, have shown that to reduce short-channel effects for sub-0.05 µm MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of a typical prior art double-gated MOSFET consists of a very thin vertical Si layer (Fin) for the channel, with two gates, one on each side of the channel. The term "Fin" is used herein to denote a semiconducting material which is employed as the body of the FET. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

One problem with prior art structures which comprise symmetric polysilicon gates on a FinFET is that the symmetric polysilicon gate FinFET structure will result in threshold voltages that are not compatible with existing CMOS circuit designs. For example, the NFET threshold voltage will be negative and the PFET will be quite positive. A potential solution to this problem is using a symmetric metal gate. Integration and processing difficulty has, however, made the development of a metal gate FinFET quite slow.

Another possible solution is an asymmetric doped polysilicon gate where one side of the Fin (i.e., thin film semiconducting layer) includes an N+ doped polysilicon gate and the other side of the Fin includes a P+ doped polysilicon gate. This asymmetry has been shown to shift threshold voltages to CMOS compatible levels in planar double-gate devices as well as FinFETs. Most prior art methods to integrate this asymmetry require sidewall image transfer and other difficult processing schemes. Moreover, in the prior art asymmetric polysilicon gate structures, thin polysilicon gates are employed. A problem with such structures is that thin polysilicon gates result in highly resistive gate electrodes. Additionally, the aspect ratio of the structures having thin gate electrodes makes the gate etch extremely difficult.

In view of the above-mentioned problems with prior art FinFET structures; there is a continued need for developing a new and improved asymmetric polysilicon (polySi)-containing gate. FinFET structure in which the threshold voltage is compatible with current CMOS circuit designs and where low resistive gate electrodes are realized.

SUMMARY OF THE INVENTION

One object of the present invention is to provide a FinFET structure containing asymmetric polySi-containing gates which make the threshold voltage of the structure compatible with current CMOS circuit designs. The term "polysilicon-containing" is used herein to denote materials that are comprised of polySi or polySiGe.

Another object of the present invention is to provide an asymmetric FinFET structure wherein low resistive gate electrodes are employed.

A still further object of the present invention is to provide an asymmetric FinFET structure in which the asymmetric polySi-containing gates are interconnected by an interconnect layer.

A yet further object of the present invention is to provide an asymmetric FinFET structure wherein a planarizing structure is present atop the asymmetric FinFET structure.

These and other objects and advantages are achieved in the present invention by providing a structure where an implanted asymmetric polySi-containing gate FinFET is integrated with a thick polySi-containing outer gate electrode (i.e., the planarizaing structure). The integrated FinFET/thick polySi-containing gate structure allows for the production of a FinFET structure in which the threshold voltage is compatible with current CMOS circuit designs and the resistivities of the gate electrodes are lower than conventional asymmetric FinFETs.

One aspect of the present invention relates to a method of forming a plurality of conductive structures on a substrate. Specifically, the inventive method includes the steps of:

forming a first semiconductor structure of a first conductivity type, a second semiconductor structure of a second conductivity type, and a third semiconductor structure on a substrate, said third semiconductor structure is disposed between said first and second semiconductor structures and is separated therefrom by an insulator structure;

depositing an interconnect layer over at least said first, second and third semiconductor structures;

forming a planarizing conductor on said interconnect layer, said planarizing conductor having etch characteristics similar to those of said interconnect layer and said first and second semiconductor structures, but different from those of said insulator structure; and patterning and etching said planarizing conductor, said interconnect layer, and said first and second semiconductor structures so that each has at least one lateral dimension that is substantially the same.

Another aspect of the present invention relates to an asymmetric field effect transistor (FET) which includes:

a p-type gate portion and an n-type gate portion on a vertical semiconductor body;

an interconnect between said p-type gate portion and said n-type gate portion; and a planarizing structure above said interconnect.

DETAILED DESCRIPTION OF THE INVENTION

Figure 1A:
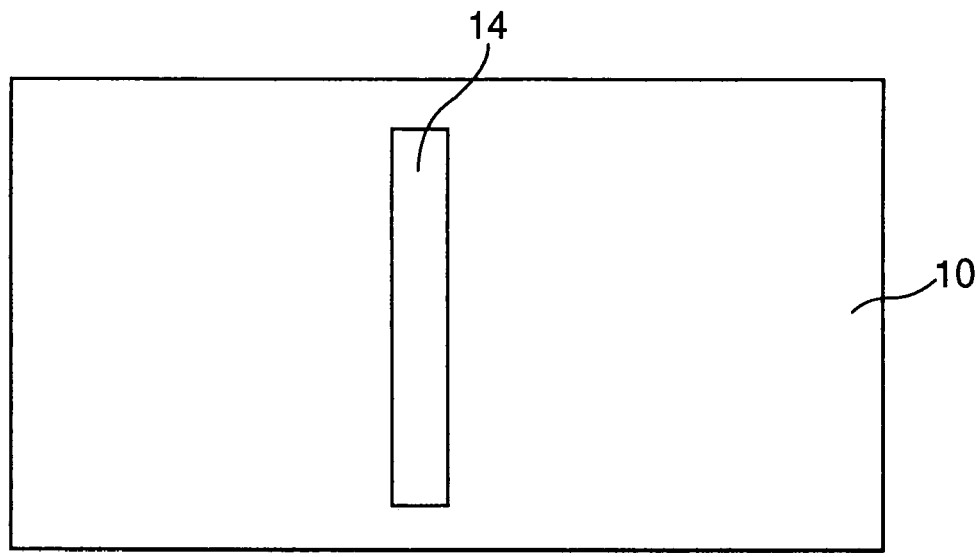
FIGS. 1–9 are pictorial representations (including A: top view; and B: cross-sectional view) showing the various processing steps employed in fabricating the inventive asymmetric FET structure.

The present invention, which provides an asymmetric FET structure and method of fabricating the same, will now be described in greater detail by referring to the drawings that accompany the present application.

Reference is first made to the initial structure shown in FIGS. 1A (top view) and 1B (cross-sectional view) which is employed in the present invention in fabricating the implanted asymmetric doped polySi-containing gate FinFET structure. Specifically, FIGS. 1A and 1B show a structure that includes substrate 10 having a patterned stack comprising a semiconductor body region, i.e., Fin, 12, and hard mask 14 present atop substrate 10.

The substrate includes upper portion 10u which is comprised of an insulating material such as an oxide, nitride, oxynitride or multilayers thereof, and bottom portion 10b which is comprised of a semiconducting material such as Si. Note that regions 10 and 12 may be part of an SOI (silicon-on-insulator) material wherein region 10u is a buried oxide layer which is sandwiched between semiconducting materials 10b and 12. Alternatively, layers 10u and 12 are layers which are separately deposited atop a semiconductor substrate.

The semiconductor body region, i.e., Fin region 12, is comprised of any semiconducting material such as single crystalline Si and the hard mask is comprised of an oxide, nitride, oxynitride or multilayers thereof. The vertical thicknesses of semiconducting material layer 12 (i.e., Fin 12) and the hard mask are not critical to the present invention. Typically, semiconducting material layer 12 has a vertical thickness of from about 300 to about 2000 Å, whereas the hard mask has a vertical thickness of from about 100 to about 1000 Å.

Figure 1B:
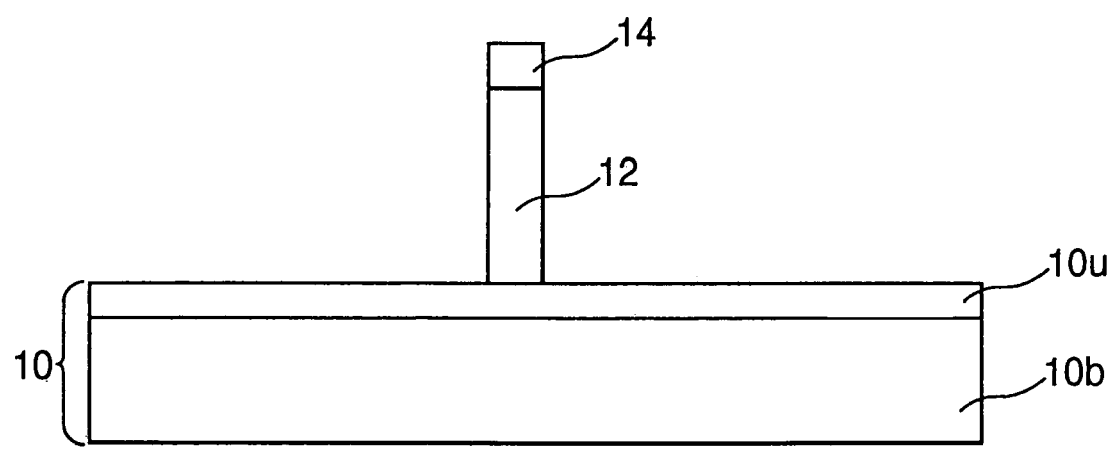

The structure shown in FIGS 1A–1B is fabricated utilizing conventional processes well known to those skilled in the art. For example, hard mask 14 is formed atop a layer of semiconducting material by utilizing a conventional deposition process such as chemical vapor deposition (CVD), plasma-assisted CVD, or chemical solution deposition. Alternatively, hard mask 14 may be grown on semiconducting material layer 12 (i.e., Fin 12) utilizing a conventional thermal oxidation, nitridation or oxynitridation process well known to those skilled in the art.

Following formation of the hard mask material on semiconducting material layer 12, the structure is subjected to conventional lithography (including applying a photoresist to the hard mask, exposing the photoresist to a pattern of radiation, and developing the pattern into the photoresist using a conventional resist developer) and dry etching such as reactive-ion etching, ion beam etching, plasma-etching or laser ablation. The etching step may include a single etching process or multiple etching processes using one or more of the above mentioned dry etching processes may be employed to provide the structure illustrated in FIGS 1A–1B. After etching, the photoresist is removed from the structure utilizing a conventional stripping process well known to those skilled in the art.

Figure 2A:
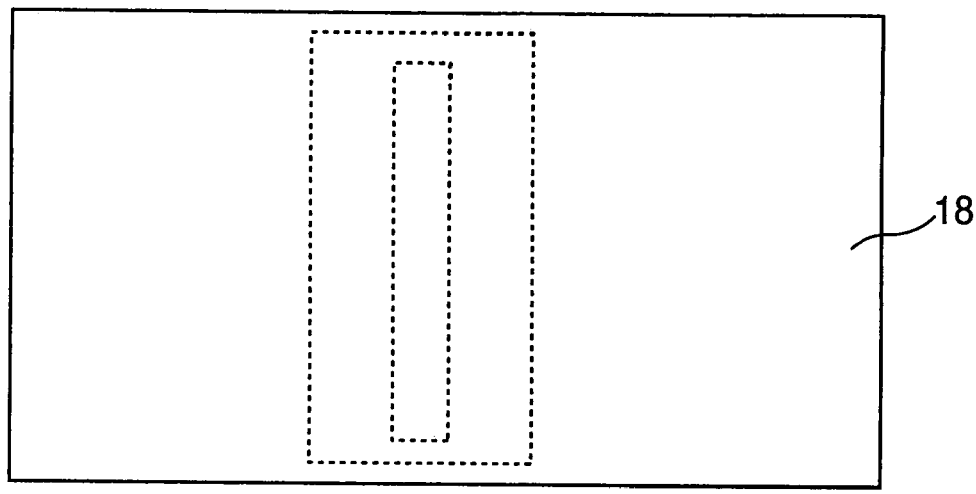
Figure 2B:
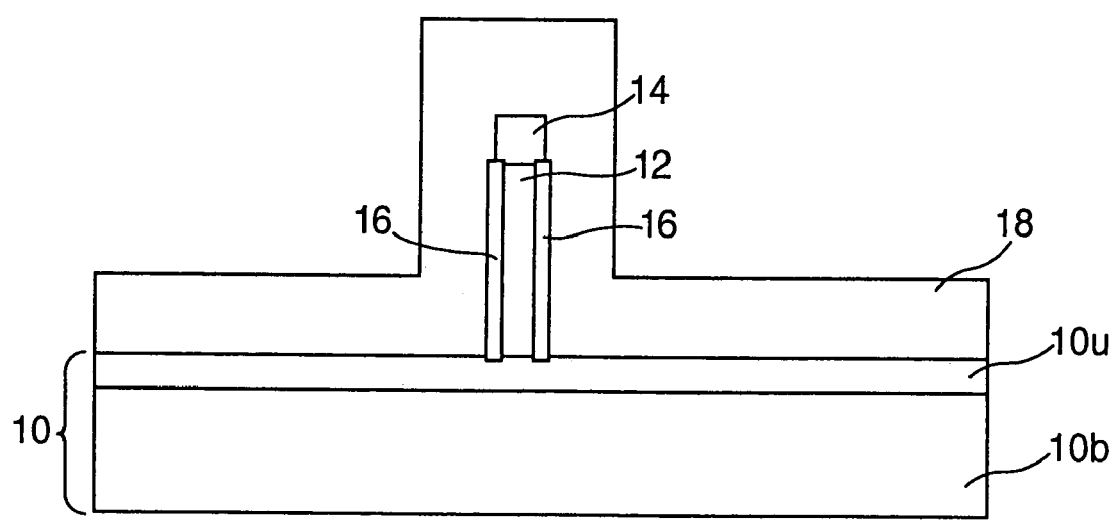

Next, the structure shown in FIGS. 1A–1B is then subjected to a conventional oxidation, nitridation or oxynitridation process which is capable of forming gate dielectric 16 on exposed sidewalls of Fin layer 12. Following formation of the gate dielectric on the exposed sidewalls of Fin 12, thin polysilicon-containing layer 18 is formed over the entire surface of the structure utilizing a conventional deposition process such as CVD providing the structure shown in FIGS. 2A–2B. The term "polysilicon (i.e., polySi)-containing" is used herein to denotes a layer that is comprised of polySi or polySiGe. In-one highly preferred embodiment of the present invention, the polySi-containing layer 18 is comprised of polySi. Polysilicon-containing layer 18 is a thin layer whose thickness is significantly thinner than the height of the Fin to provide the appropriate shadow angles required in the subsequent angled implant step. In the present invention, Fin 12 typically has a height from about 300 to about 2000 Å and polysilicon-containing layer 18 has a thickness of from about 150 to about 1000 Å. More preferably, Fin 12 has a height from about 900 to about 1200 Å and polysilicon-containing layer 18 has a thickness of from about 500 to about 800 Å.

It is noted that Fin region 12 represents a third semiconductor structure which is surrounded by insulating structure (layers 10u, 14, and 16) of the inventive asymmetric FinFET structure.

Figure 3A:
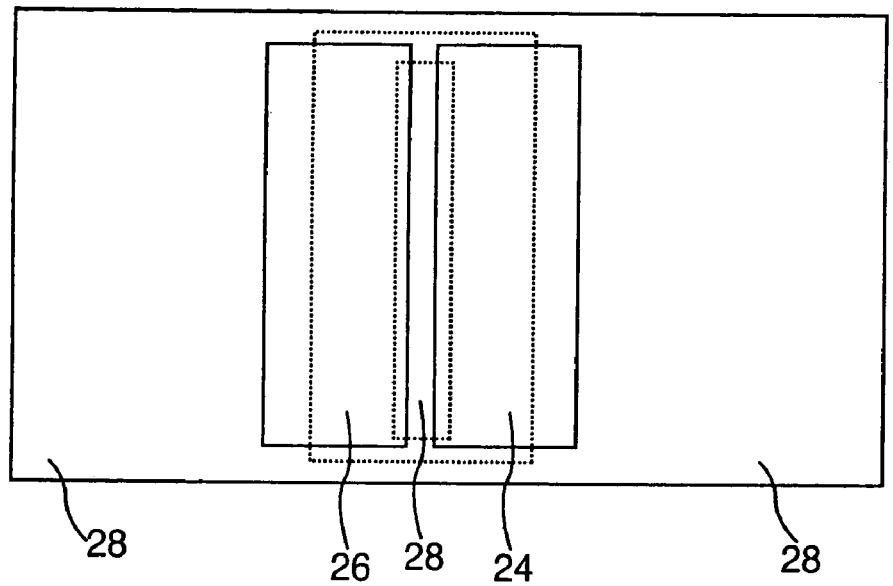
Figure 3B:
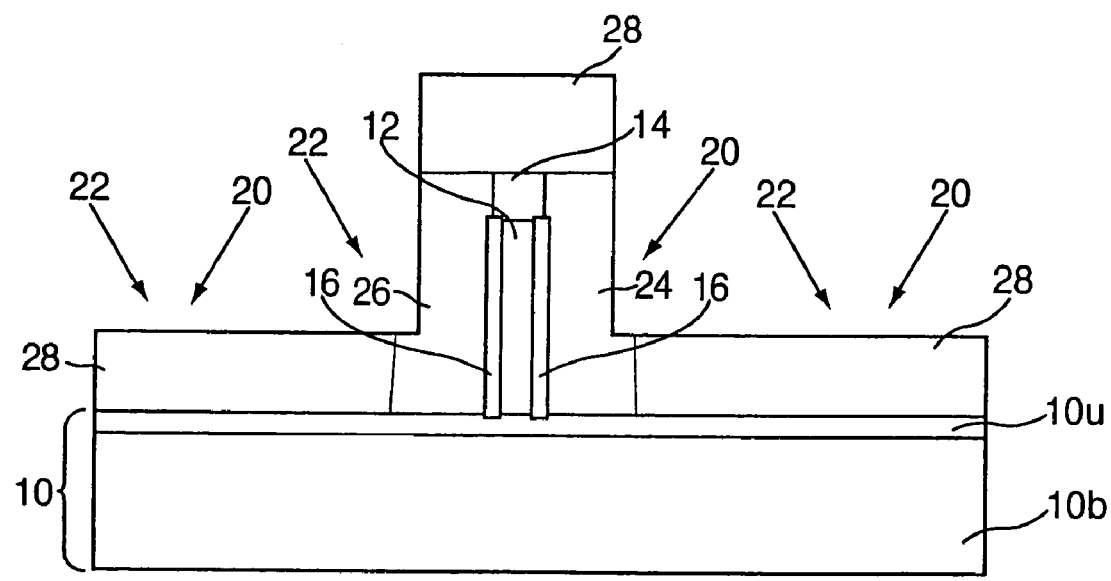

Next, and as shown in FIGS. 3A–3B, asymmetric implants are performed which are capable of forming first semiconductor structure 24 of a first conductivity type (e.g., N+ implant region or n-type gate portion) on one side of Fin 12 and second semiconductor structure 26 of a second conductivity type (e.g., P+ implant region or p-type gate portion) on the other side of Fin 12. Specifically, an n-type dopant 20 and a p-type dopant 22 are implanted into polysilicon-containing layer 18 using a, double angled implant process which is capable of forming implant regions having a final dopant concentration on the order of from about 1E19 to about 1E21 atoms/cm$^3$. Due to the shadowing of the structure, the gate sides (i.e., vertical portions of polySi-containing layer 18) remain doped (either N+ or P+) with the species implanted from that side, while the horizontal portions of polySi-containing layer 18 are counter-doped, i.e., double implanted, such that those areas are not doped N+ or P+. The double implant regions are labeled as 28 in FIGS. 3A–3B.

Figure 4A:
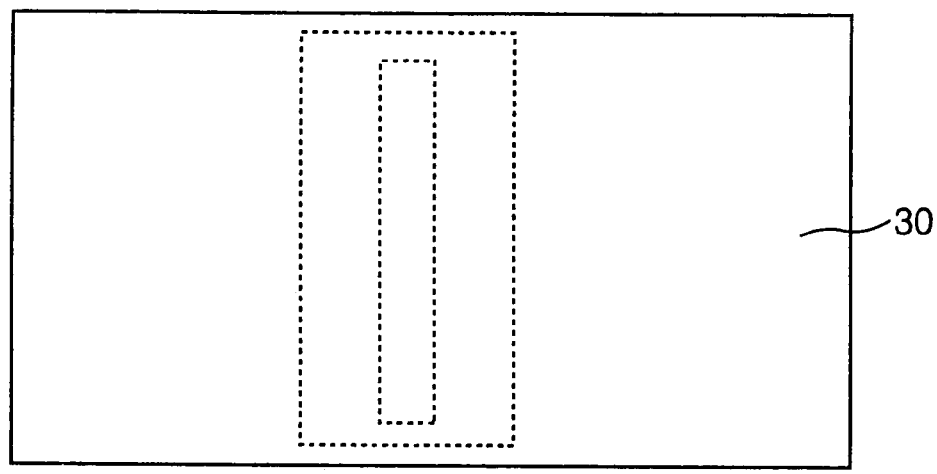
Figure 4B:
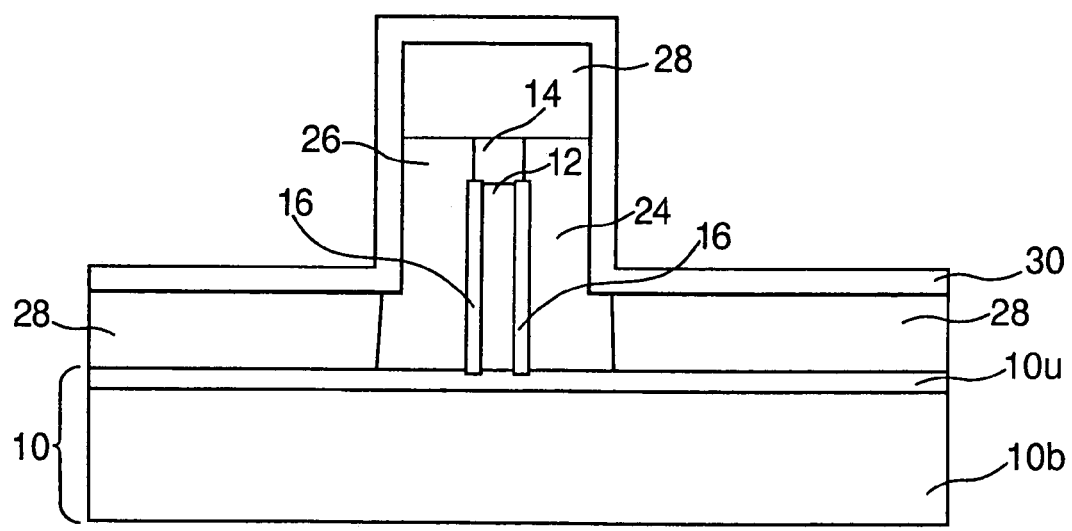

Following the asymmetric implant process described above, metallic layer 30 is formed atop all exposed surfaces shown in FIGS. 3A–3B so as to provide the structure illustrated, for example, in FIGS. 4A–4B. The metallic layer, which is formed utilizing a conventional deposition process such as CVD, sputtering or plasma-assisted CVD, has a thickness,of from about 20 to about 1000 Å, with a thickness of from about 100 to about 500 Å being more highly preferred. The metallic layer formed at this point of the inventive method may comprise any conductive metal or metal alloy such as, but not limited to: W, TiN, and Ta. Note that metallic layer 30 contacts both gate regions, i.e., regions 24 and 26, hence metallic layer 30 is referred herein as an interconnect layer. In some embodiments of the present invention, the metallic layer may be transferred into a metallic silicide at this point of the inventive process. The transformation is carried out using a conventional annealing process well known to those skilled in the art (including, for example, the annealing conditions mentioned hereinbelow). In yet another embodiment, which is described hereinbelow, the transformation annealing occurs later in the inventive process at the same time as activation of the source and drain regions. In still another embodiment of the present invention, the metallic layer is not converted into a metallic silicide layer.

Figure 5A:
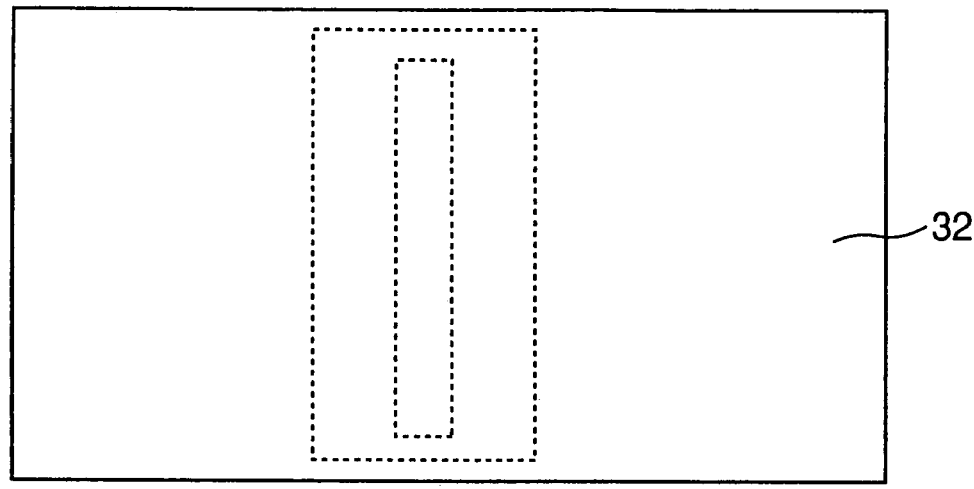
Figure 5B:
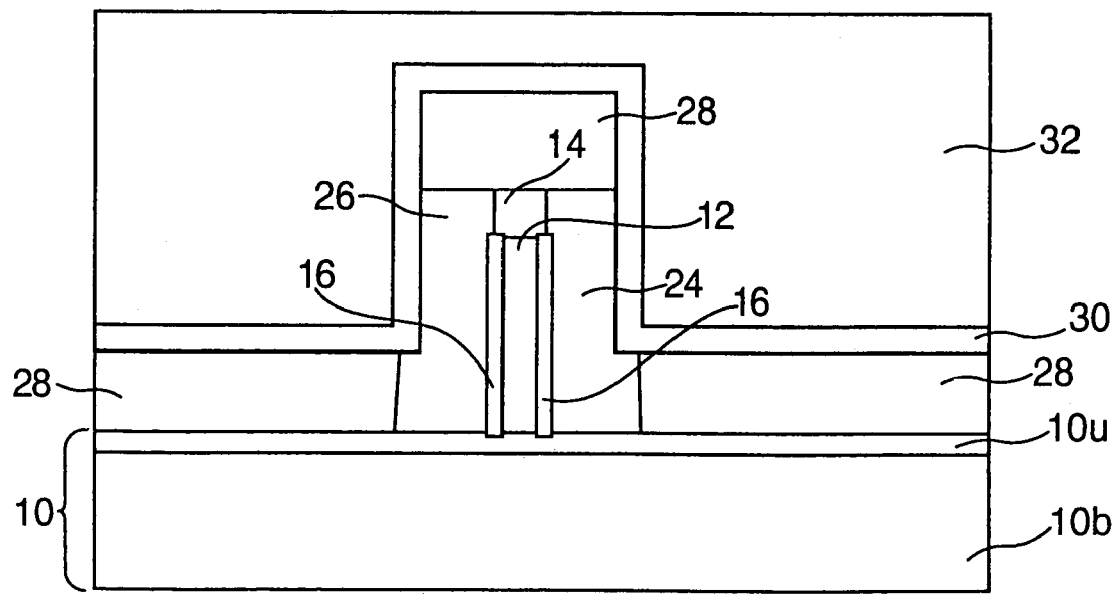

After forming the metallic layer on the structure so as to interconnect the first and second semiconductor structures to each other, a planarizing polySi-containing layer (or other conductive material such as a conductive metal or metal alloy) 32 is formed atop metallic layer 30 so as to provide the structure shown in FIGS. 5A–5B. Specifically, a thick polySi-containing layer composed of polySi or polySiGe is formed by a conventional deposition process and thereafter the thick polySi-containing layer is planarized by a conventional planarization process such as chemical-mechanical polishing (CMP). The term "thick polySi-containing layer" denotes a polySi-containing layer having a thickness of from about 500 to about 2000Å, with a thickness of from about 800 to about 1500 Å being more highly preferred. It is noted that the planar conductor formed at this point of the inventive process has etch characteristics similar to those of metallic interconnect layer 30 and the first and second semiconductor structures (regions 24 and 26), yet different from those of insulating structure.

Figure 6A:
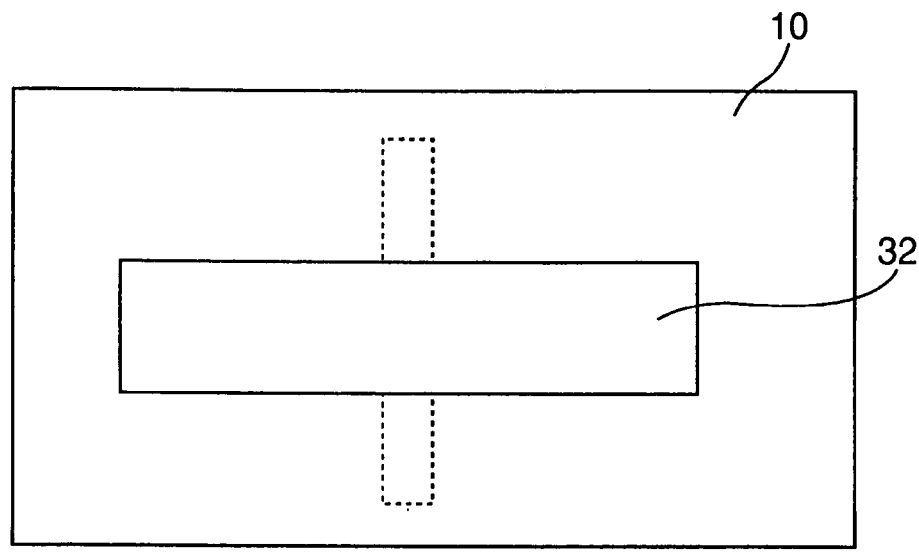
Figure 6B:
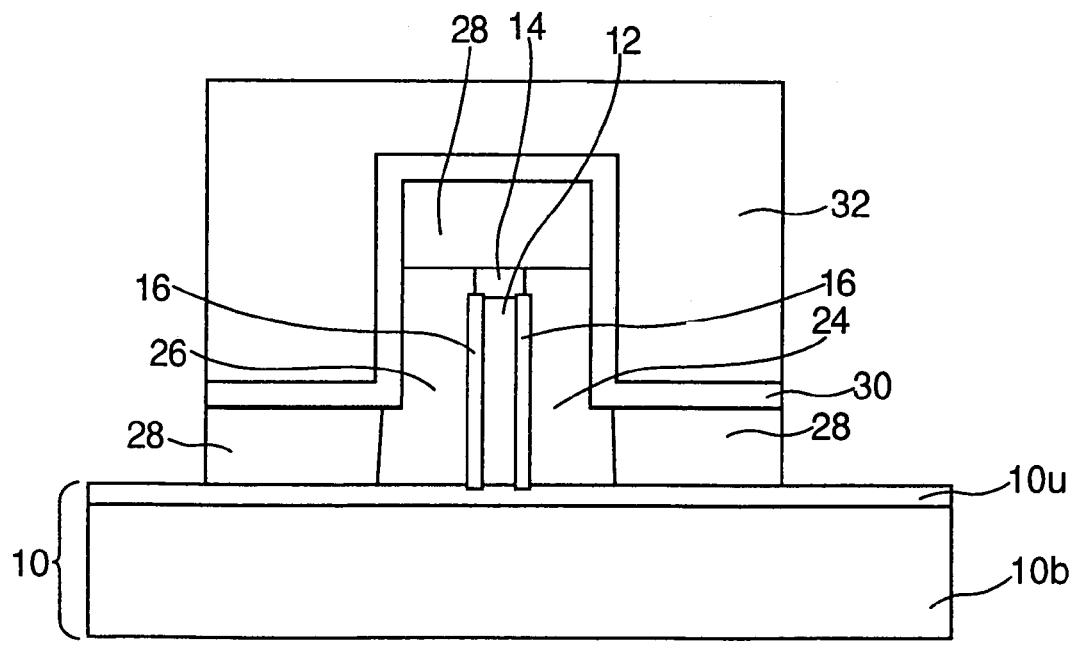

Conventional patterning (i.e., lithography) and etching are then performed so as to provide the structure shown in FIG. 6A–6B. Note that portions of planarizing conductor 32, metallic interconnect 30, first and second semiconductor structures 24 and 26, respectively, are patterned and etched such that those regions have at least one lateral dimension that is substantially the same. That is, this etching step is capable of etching the above layers such that each of the etched layers has the same final shape.

Next, a conventional implantation process is performed so as to form source/drain implant regions 33 in the structure in areas adjacent to the Fin region; See FIGS. 7A–7B. Note that during this implant process, polysilicon-containing layer 32 is converted into doped polySi-containing layer 34, but metallic layer 30 serves as a diffusion barrier preventing dopant from being implanted into the oppositely doped polySi-containing gate regions. The doping at this point may be either n or p-type. In one embodiment of the present invention the exposed areas adjacent to Fin 12 are doped using different implant species such as As and B so as to form source/drain regions 33 which have donor or acceptor impurities, respectively.

Figure 7A:
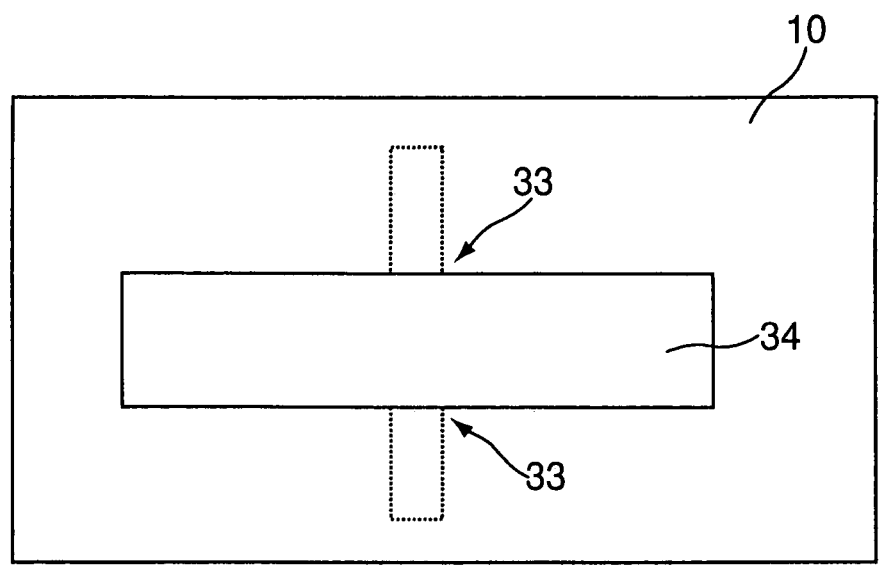
Figure 7B:
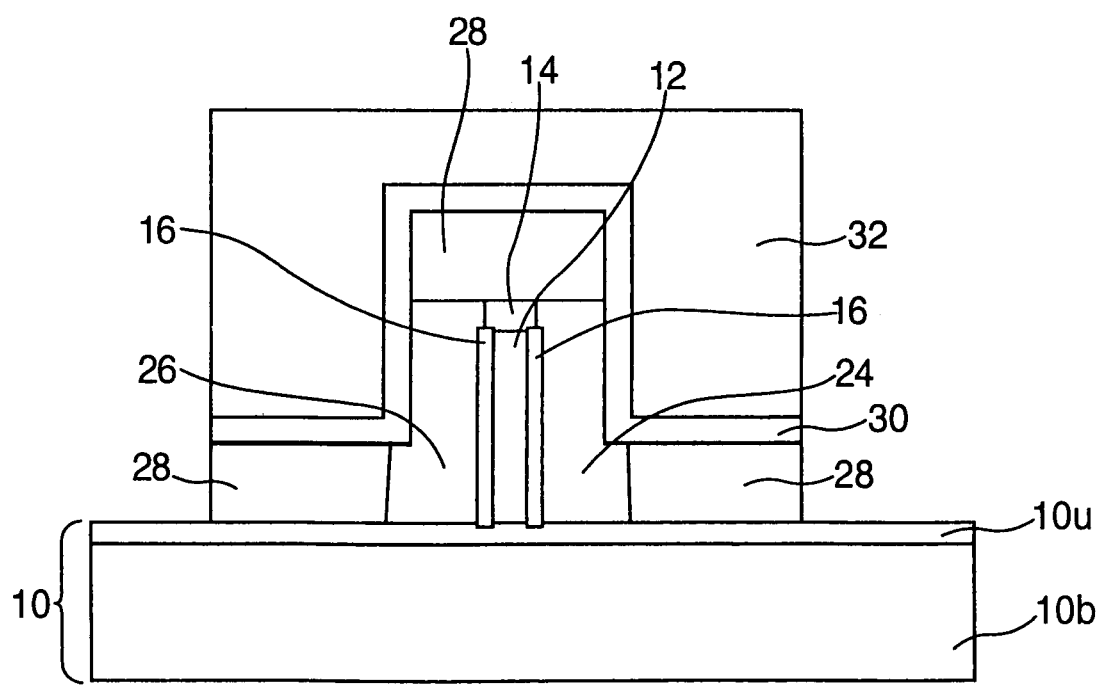
Figure 8A:
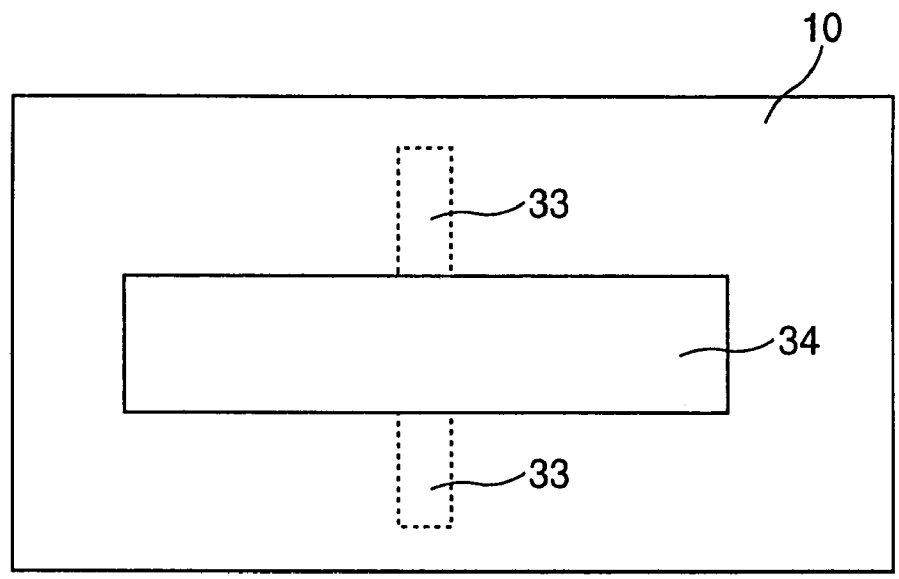
Figure 8B:
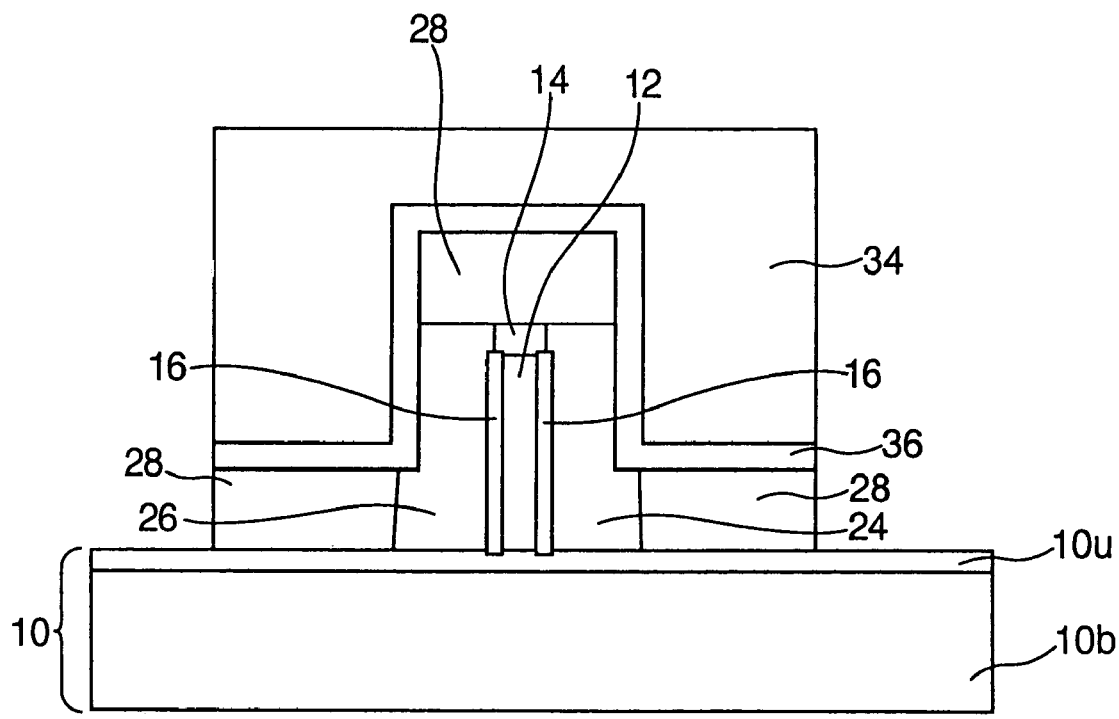

Following formation of the structure shown in FIGS. 7A–7B, that structure is subjected to an activation annealing process which is capable of activating the source/drain regions as well as converting the metallic interconnect layer into metallic silicide (or metallic nitride) layer 36 which bridges the two polySi-containing layers. This eliminates the pn-junction in the gate and provides a contact between the top doped polySi-containing layer, i.e., layer 34, and the gate electrodes (i.e., double implanted polySi-containing regions 28). The resultant structure after performing the activation annealing step is shown, for example, in FIG. 8A–8B.

Specifically, activation annealing is carried out at a temperature of about 700° C. or higher in the presence of an inert gas atmosphere such as He, $N_2$, Ar, Xe and Kr, that may be optionally admixed with $H_2$. More preferably, the activation annealing is performed at a temperature of from about 850° to about 1000° C. in the presence of He or Ar.

Figure 9A:
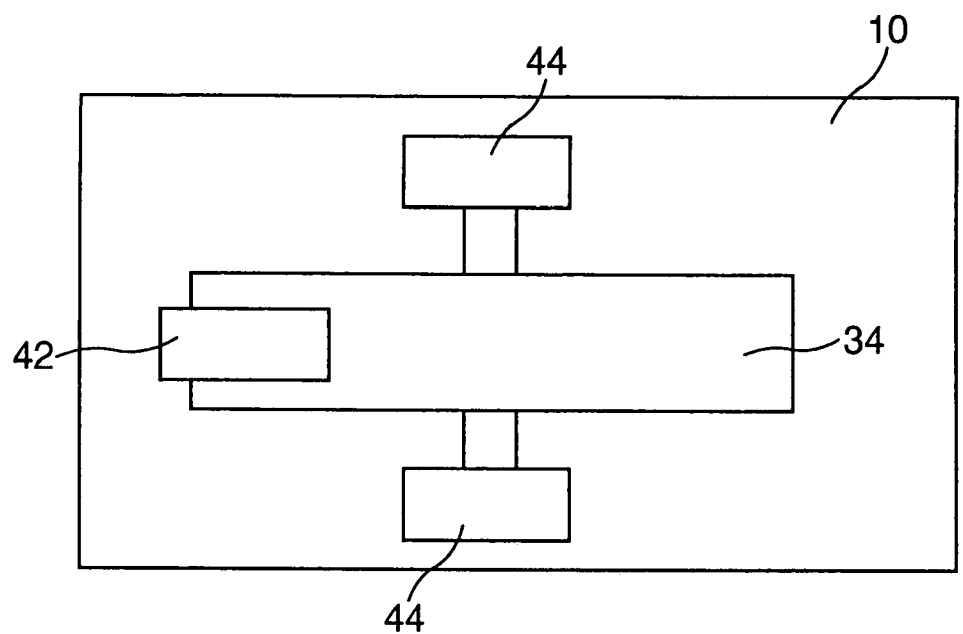
Figure 9B:
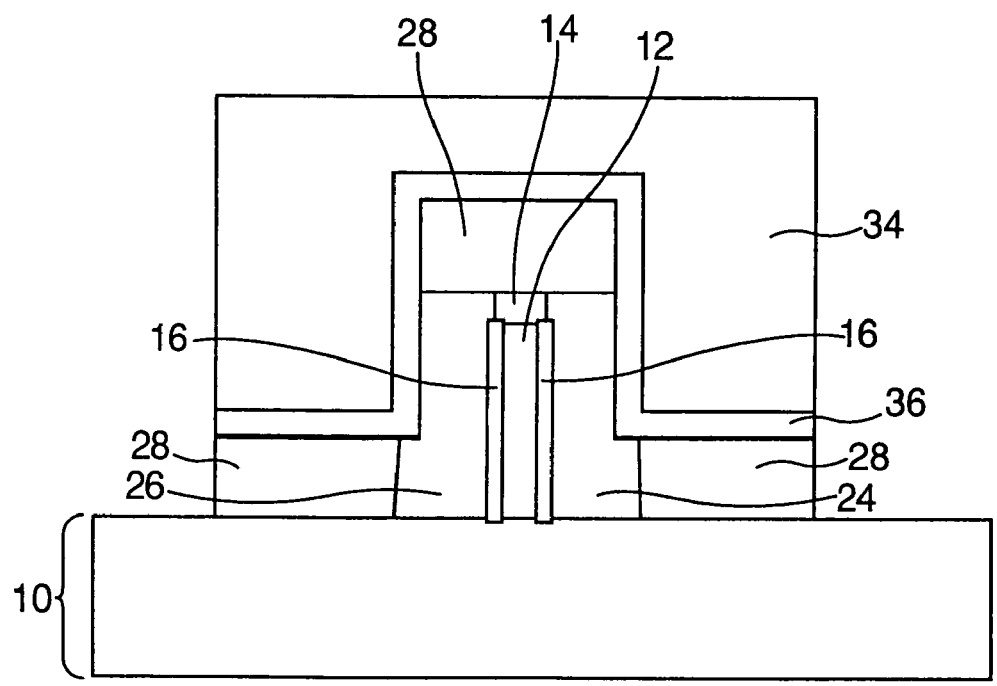

Following the activation annealing step, standard FinFET finishing processing steps including formation of gate contact 42, and source/drain contacts 44, are performed providing the structure shown in FIGS. 9A–9B.

In some embodiments of the present invention, double implanted gate regions 28 and doped region 34 are composed of a semiconducting material instead of a polySi-containing material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A method of forming a plurality of conductive structures on a substrate comprising the steps of:

forming a first semiconductor structure of a first conductivity type, a second semiconductor structure of a second conductivity type, and a third semiconductor structure on a substrate, said third semiconductor structure is disposed between said first and second semiconductor structures and is separated therefrom by an insulator structure;

depositing an interconnect layer over at least said first, second and third semiconductor structures;

forming a planarizing conductor on said interconnect layer, said planarizing conductor having etch characteristics similar to those of said interconnect layer and said first and second semiconductor structures, but different from those of said insulator structure; and patterning and etching said planarizing conductor, said interconnect layer, and said first and second semiconductor structures so that each has at least one lateral dimension that is substantially the same.

2. The method of claim 1 wherein said first and second semiconductor structures are formed utilizing a double angled implant such that vertical surfaces of a polySi-containing or semiconducting layer formed abutting said insulator structure are oppositely doped, while horizontal surfaces of said polySi-containing or semiconducting layer are doubly doped.

3. The method of claim 2 wherein said polySi-containing layer is comprised of polySi.

4. The method of claim 2 wherein said polySi-containing layer is comprised of polySiGe.

5. The method of claim 2 wherein said double angled implant is performed so as to provide implant regions whose final dopant concentration is on the order of from about 1E19 to about 1E21 atoms/cm3.

6. The method of claim 1 wherein said insulator structure includes a gate dielectric and a hard mask.

7. The method of claim 1 wherein said interconnect layer is a metallic layer which is capable of preventing dopant diffusion into said first and second semiconductor structures.

8. The method of claim 1 wherein said planarizing conductor is comprised of a polySi-containing material, a conductive metal, a conductive metal alloy or a semiconducting material.

9. The method of claim 8 wherein said planarizing conductor is comprised of polySi or polySiGe.

10. The method of claim 1 further comprising annealing said interconnect layer so as to convert said layer into a metal silicide or metal nitride.

11. The method of claim 10 wherein said annealing is carried out at a temperature of about 700° C. or higher and in the presence of an inert gas atmosphere.

* * * * *